US012772915B2

(12) United States Patent
Chae et al.

(10) Patent No.: US 12,772,915 B2
(45) Date of Patent: Oct. 20, 2026

(54) SEMICONDUCTOR PACKAGE AND METHOD OF MANUFACTURING A SEMICONDUCTOR PACKAGE

(71) Applicant: SAMSUNG ELECTRONICS CO., LTD., Suwon-si (KR)

(72) Inventors: Seunghun Chae, Suwon-si (KR); Unbyoung Kang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 331 days.

(21) Appl. No.: 18/662,240

(22) Filed: May 13, 2024

(65) Prior Publication Data

US 2024/0404935 A1 Dec. 5, 2024

(30) Foreign Application Priority Data

Jun. 1, 2023 (KR) ........................ 10-2023-0070902
Jul. 26, 2023 (KR) ........................ 10-2023-0097426

(51) Int. Cl.
*H10W 70/65* (2026.01)
*H10W 70/66* (2026.01)
(Continued)

(52) U.S. Cl.
CPC ......... *H10W 90/401* (2026.01); *H10W 70/65* (2026.01); *H10W 70/66* (2026.01);
(Continued)

(58) Field of Classification Search
None
See application file for complete search history.

(56) References Cited

U.S. PATENT DOCUMENTS

2012/0068332 A1* 3/2012 Park ........................ H10P 72/74 257/E21.705
2015/0282315 A1 10/2015 Choi et al.
(Continued)

FOREIGN PATENT DOCUMENTS

CN 103811448 A * 5/2014 .......... H10W 90/701
KR 10-1212525 12/2012
(Continued)

*Primary Examiner* — Cory W Eskridge
(74) *Attorney, Agent, or Firm* — Fish & Richardson P.C.

(57) ABSTRACT

A semiconductor package includes a redistribution structure that includes a lower insulating layer, redistribution layers in the lower insulating layer, and first vias connected to the redistribution layers. The semiconductor package further includes a semiconductor chip on an upper surface of the redistribution structure and electrically connected to the redistribution layers; an interconnection structure on the upper surface of the redistribution structure and including an upper insulating layer, a plurality of interconnection layers, and second vias connecting the interconnection layers to each other; an encapsulant covering the semiconductor chip and the interconnection structure; and external connection conductors on a lower surface of the redistribution structure and electrically connected to the redistribution layers. A lowermost interconnection layer includes a first conductive layer contacting a second via and tapered toward the upper surface, and a second conductive layer surrounding the first conductive layer and in contact with a first via.

16 Claims, 12 Drawing Sheets

(51) Int. Cl.

| | |
|---|---|
| ***H10W 70/685*** | (2026.01) |
| ***H10W 90/00*** | (2026.01) |
| *H10W 70/05* | (2026.01) |
| *H10W 74/10* | (2026.01) |

(52) U.S. Cl.

CPC ......... *H10W 70/685* (2026.01); *H10W 90/00* (2026.01); *H10W 70/05* (2026.01); *H10W 74/10* (2026.01); *H10W 90/722* (2026.01); *H10W 90/752* (2026.01); *H10W 90/754* (2026.01); *H10W 90/794* (2026.01)

(56) References Cited

U.S. PATENT DOCUMENTS

| | | | | |
|---|---|---|---|---|
| 2020/0066613 | A1* | 2/2020 | Lee | H10W 40/228 |
| 2021/0143118 | A1* | 5/2021 | Joo | H10W 70/09 |
| 2022/0068780 | A1 | 3/2022 | Kang et al. | |
| 2023/0101149 | A1* | 3/2023 | Yoo | H10W 40/22<br>257/773 |
| 2024/0332157 | A1* | 10/2024 | Baek | H10P 72/74 |

FOREIGN PATENT DOCUMENTS

| | | |
|---|---|---|
| KR | 10-2015-0111682 | 10/2015 |
| KR | 10-2016-0004189 | 1/2016 |
| KR | 10-2019-0124503 | 11/2019 |
| KR | 10-2020-0077369 | 6/2020 |
| KR | 10-2021-0002454 | 1/2021 |
| KR | 10-2022-0086321 | 6/2022 |

* cited by examiner

100A

'A'

SEMICONDUCTOR PACKAGE AND METHOD OF MANUFACTURING A SEMICONDUCTOR PACKAGE

CROSS-REFERENCE TO RELATED APPLICATION(S)

This application claims priority to Korean Patent Application No. 10-2023-0097426 filed on Jul. 26, 2023, and Korean Patent Application No. 10-2023-0070902 filed on Jun. 1, 2023, in the Korean Intellectual Property Office, the disclosures of which are incorporated herein by reference in their entirety.

BACKGROUND

In accordance with reduced weight and high performance of an electronic device, a semiconductor chip having a reduced size and high performance and a semiconductor package having a reduced thickness have been developed. As materials having different coefficients of thermal expansion may be used in a package, issues such as warping or cracking have emerged in a process in which high temperatures are applied, which may decrease connection reliability between the semiconductor chip and the package substrate.

SUMMARY

This disclosure provides a semiconductor package having improved reliability.

According to an aspect of the present disclosure, a semiconductor package includes a redistribution structure having an upper surface and a lower surface opposing each other, and including a lower insulating layer, a plurality of redistribution layers disposed in the lower insulating layer, and first vias connected to the plurality of redistribution layers, respectively; a semiconductor chip disposed on an upper surface of the redistribution structure and electrically connected to the plurality of redistribution layers; an interconnection structure disposed on the upper surface of the redistribution structure and including an upper insulating layer, a plurality of interconnection layers disposed in the upper insulating layer, and second vias connecting the plurality of interconnection layers to each other; an encapsulant covering at least a portion of each of the semiconductor chip and the interconnection structure on the upper surface of the redistribution structure; and external connection conductors disposed on the lower surface of the redistribution structure and electrically connected to the plurality of redistribution layers, wherein a lowermost interconnection layer adjacent to the upper surface of the redistribution structure among the plurality of interconnection layers includes a first conductive layer in contact with one of the second vias and tapered toward the upper surface, and a second conductive layer surrounding the first conductive layer and in contact with one of the first vias.

According to an aspect of the present disclosure, a semiconductor package includes a redistribution structure including a plurality of redistribution layers; a semiconductor chip disposed on the redistribution structure and electrically connected to the plurality of redistribution layers; an interconnection structure disposed on the redistribution structure, including an insulating layer, a lowermost interconnection layer disposed in the insulating layer to expose a lower surface, upper interconnection layers disposed in or on the insulating layer, and interconnection vias electrically connecting the lowermost interconnection layer to the upper interconnection layers; and an encapsulant covering at least a portion of the semiconductor chip and the interconnection structure on the redistribution structure, wherein the lower surface of the lowermost interconnection layer is configured as an outwardly curved surface, curved toward the redistribution structure.

According to an aspect of the present disclosure, a method of manufacturing a semiconductor package includes preparing an interconnection structure including an upper insulating layer and a plurality of interconnection layers disposed in or on the upper insulating layer, wherein the interconnection structure has a first surface adjacent to a lowermost interconnection pattern among the plurality of interconnection layers, and a cavity region disposed on a second surface and a central portion opposite to the first surface; attaching the first surface of the interconnection structure to an adhesive film; attaching a semiconductor chip to the adhesive film in the cavity region of the interconnection structure and encapsulating at least a portion of the semiconductor chip; removing the adhesive film and attaching a protective film to the semiconductor chip; forming a replating region by etching at least a portion of the lowermost interconnection pattern; forming a replating layer in the replating region and forming a lowermost interconnection layer including the replating layer; and forming a redistribution structure including a plurality of redistribution layers on the first surface of the interconnection structure.

BRIEF DESCRIPTION OF DRAWINGS

The above and other aspects, features, and advantages in the implementations will be more clearly understood from the following detailed description, taken in combination with the accompanying drawings, in which.

DETAILED DESCRIPTION

Figure 1A:
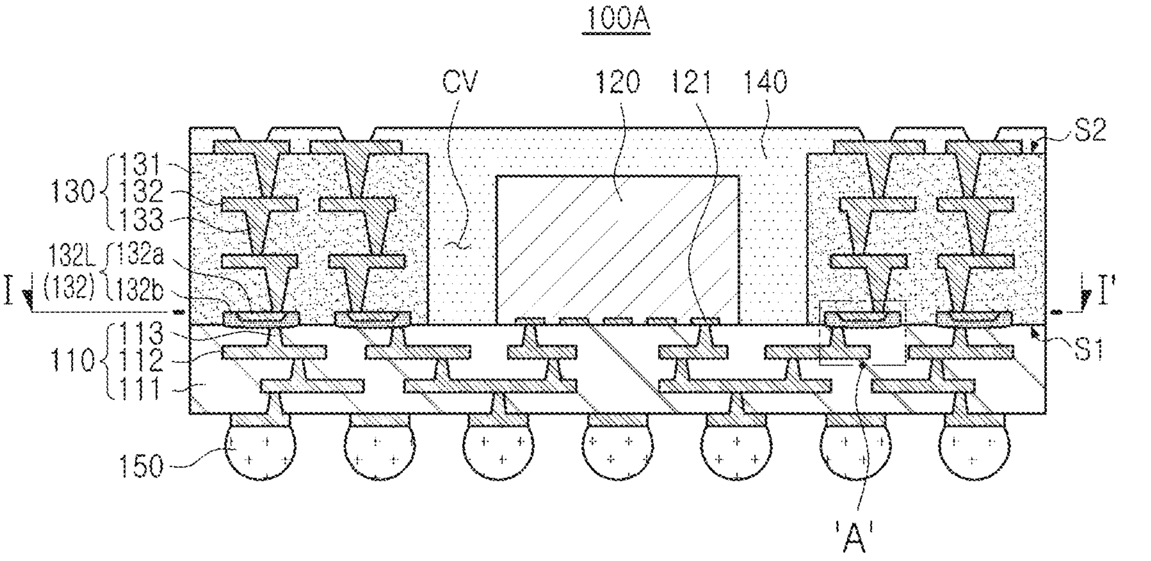
FIG. 1A is a cross-sectional diagram illustrating a semiconductor package according to some implementations of the present disclosure.
Figure 1B:
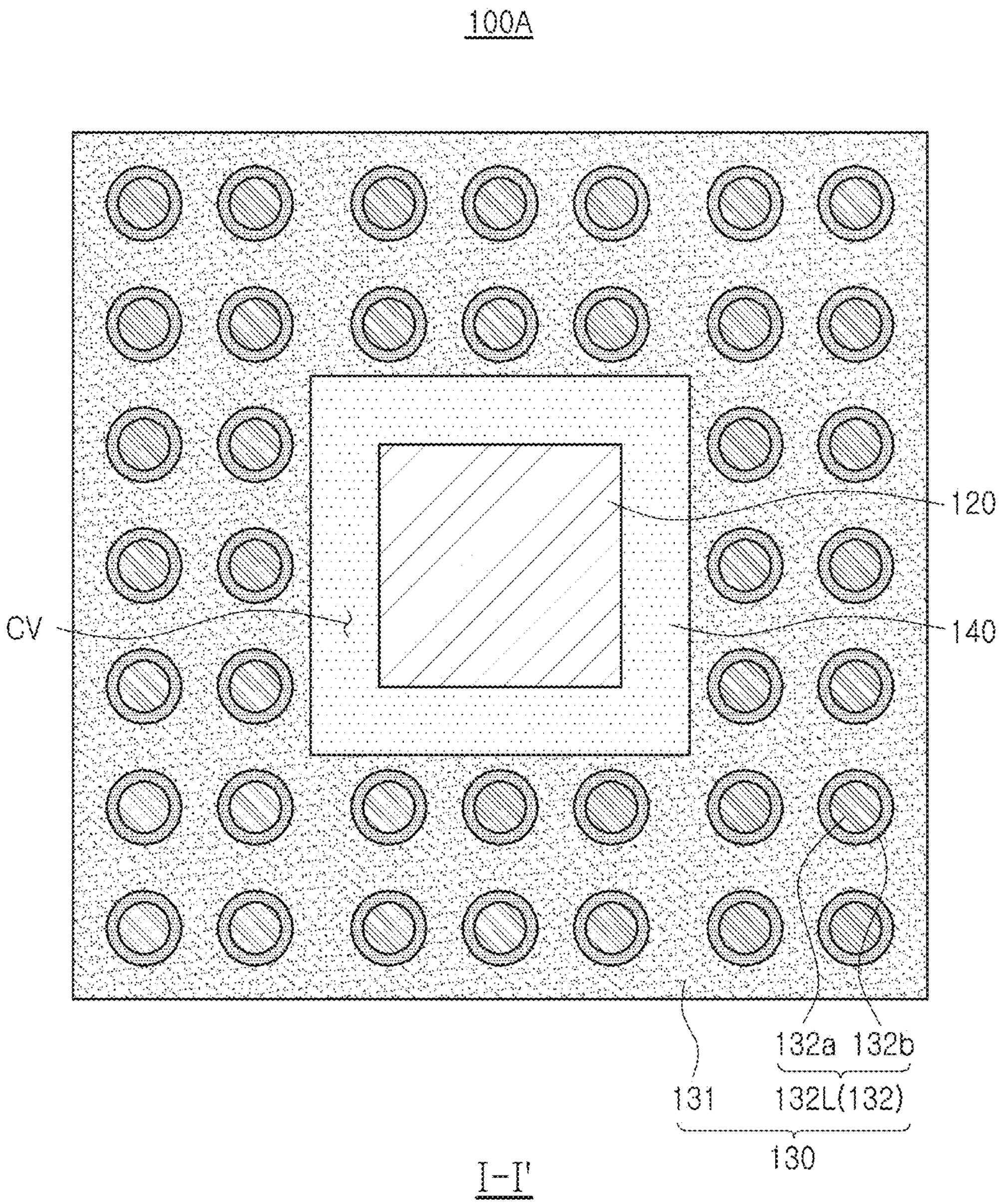
FIG. 1B is a plan cross-sectional diagram taken along line I-I' in FIG. 1A.
Figure 1C:
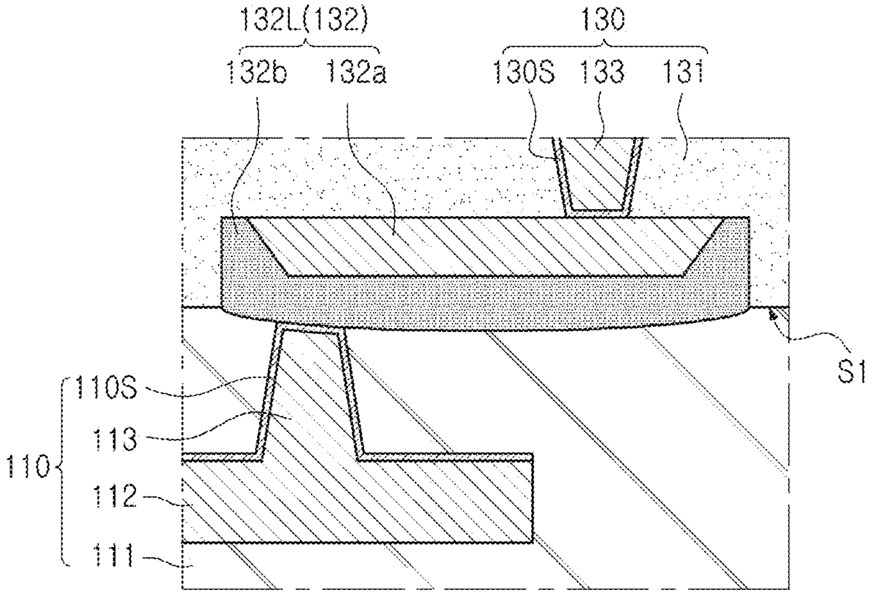
FIG. 1C is an enlarged diagram illustrating a region corresponding to region 'A' in FIG. 1A.

FIG. 1A is a cross-sectional diagram illustrating a semiconductor package according to some implementations. FIG. 1B is a plan cross-sectional diagram taken along line I-I' in FIG. 1A. FIG. 1C is an enlarged diagram illustrating a region corresponding to region 'A' in FIG. 1A.

Referring to FIGS. 1A, 1B, and 1C, a semiconductor package 100A in some implementations includes a redistribution structure 110, a semiconductor chip 120, an interconnection structure 130, and an encapsulant 140. Also, the semiconductor package 100A may further include external connection conductors 150.

The redistribution structure 110 may be configured as a support substrate on which the semiconductor chip 120 is mounted, and may be configured as a substrate for a package including a plurality of redistribution layers 112 for redistributing the semiconductor chip 120. The substrate for the package may include a printed circuit board (a PCB, a ceramic substrate, a glass substrate, a tape wiring board, and the like). For example, the redistribution structure 110 may include a lower insulating layer 111, redistribution layers 112 and redistribution vias 113.

The lower insulating layer 111 may include an insulating resin. The insulating resin may include a thermosetting resin such as epoxy resins, a thermoplastic resin such as polyimide, or an insulating material in which inorganic filler or/and glass fiber (e.g., prepreg) is impregnated in the resins, such as, ABF, FR-4, BT, or photoimageable dielectric (PID). The lower insulating layer 111 may include a plurality of lower insulating layers 111 stacked in a Z-axis direction. Depending on processes, a boundary between the plurality of lower insulating layers 111 may be indistinct. In some implementations, the lower insulating layer 111 may be formed using a photolithography process using PID.

The plurality of redistribution layers 112 may include, for example, a metal material including copper (Cu), aluminum (Al), silver (Ag), tin (Sn), gold (Au), nickel (Ni), lead (Pb), titanium (Ti), or alloys thereof. The redistribution layers 112 may include, for example, a ground pattern, a power pattern, and a signal pattern. The signal pattern may provide a path through which various signals, such as a data signal, are transmitted/received. The redistribution layers 112 may be provided as a plurality of redistribution layers 112 disposed on the plurality of lower insulating layers 111, respectively.

The redistribution vias 113 may electrically connect the redistribution layers 112 adjacent in the vertical direction among the plurality of redistribution layers 112 and may have a tapered shape, tapered toward an upper surface of the redistribution structure 110. The redistribution vias 113 may include a signal via, a ground via, and a power via. The redistribution vias 113 may be referred to as first vias 113. The first vias 113 may include, for example, a metal material including copper (Cu), aluminum (Al), silver (Ag), tin (Sn), gold (Au), nickel (Ni), lead (Pb), titanium (Ti), or alloys thereof. The first vias 113 may be configured as a filled via in which a metal material is filled in the via hole or a conformal via in which a metal material is formed along an inner wall of the via hole. The first vias 113 may be integrated with the redistribution layers 112, but implementations thereof are not limited thereto.

The semiconductor chip 120 may be disposed on the upper surface of the redistribution structure 110 and may include connection pads 121. The connection pads 121 may be electrically connected to the redistribution layers 112 through the first vias 113.

The semiconductor chip 120 may include silicon (Si), germanium (Ge), or gallium arsenide (GaAs), and various types of integrated circuits may be formed therein. The integrated circuit may be implemented as a processor chip such as a central processor (e.g., CPU), a graphics processor (e.g., GPU), field programmable gate array (FPGA), an application processor (AP), a digital signal processor, a cryptographic processor, a microprocessor, a microcontroller, but implementations thereof are not limited thereto. The integrated circuit may be implemented as a logic chip such as an analog-to-digital converter and an application-specific IC (ASIC), or a volatile memory such as a dynamic RAM (DRAM), static RAM (SRAM), and a non-volatile memory, such as a phase change RAM (PRAM), a magnetic RAM (MRAM), a resistive RAM (RRAM), and a flash memory.

The interconnection structure 130 may be disposed on an upper surface of the redistribution structure 110, and may provide the interconnection layer 132 on the semiconductor package 100A. The interconnection structure 130 includes an upper insulating layer 131, an interconnection layer 132, and an interconnection via 133. Since the interconnection layer 132 and the interconnection via 133 are configured the same as or similarly to the redistribution layer 112 and the redistribution via 113 of the redistribution structure 110 described above, overlapping description will not be provided.

A lower surface of the interconnection structure 130 may be referred to as a first surface S1, and an upper surface of the interconnection structure 130 may be referred to as a second surface S2. The first surface S1 may be in direct contact with the upper surface of the redistribution structure 110. The interconnection structure 130 may have a cavity region CV in a central portion. The interconnection structure 130 may have a ring shape having a rectangular hole therein on a plane. The semiconductor chip 120 may be mounted on the cavity region of the interconnection structure 130. The semiconductor chip 120 may be spaced apart from an internal side surface of the interconnection structure 130. The interconnection structure 130 may be disposed to surround the semiconductor chip 120.

The upper insulating layer 131 may include an insulating resin. The insulating resin may include a thermosetting resin such as epoxy resins, a thermoplastic resin such as polyimide, or an insulating material in which inorganic filler or/and glass fiber (e.g., prepreg) is impregnated in the resins, such as, ABF, FR-4, BT, or PID. In some implementations, the upper insulating layer 131 may include prepreg.

The interconnection structure 130 may include interconnection vias 133 that connect adjacent interconnection layers 132 in a vertical direction. The interconnection vias 133 may be referred to as second vias 133. The second vias 133 may have a tapered shape, tapered toward the upper surface of the redistribution structure 110.

The lowermost interconnection layer 132L may be disposed on the lowest level among the plurality of interconnection layers 132 and may be closest to the upper surface of the redistribution structure 110. The lowermost interconnection layer 132L includes a first conductive layer 132*a*, which may be in contact with one of the second vias 133 and with a second conductive layer 132*b* in contact with one of the first vias 113.

The first conductive layer 132*a* may be disposed in an upper region of the lowermost interconnection layer 132L, and may correspond to a portion in which the lowermost interconnection pattern (132*p* in FIG. 6C) is etched and remains in a process described later. The first conductive layer 132*a* may have a shape of which a width may decrease downwardly from an uppermost end. In some implementations, the first conductive layer 132*a* may have a trapezoidal cross-sectional surface in which an upper side is longer than a lower side. A cross-sectional surface of the first conductive layer 132*a* may have a tapered shape, tapered toward the first surface S1 of the interconnection structure 130.

The second conductive layer 132*b* may be disposed in the lower region of the lowermost interconnection layer 132L, and may correspond to a portion formed by replating to fill the replating region (RC2 in FIG. 6D) in a process described later. The second conductive layer 132*b* may be referred to as a replating layer 132*b*. The second conductive layer 132*b* may have a shape surrounding the first conductive layer 132*a*. The second conductive layer 132*b* may be in contact with the upper surface of the redistribution structure 110. A lower surface of the second conductive layer 132*b* may have an outwardly curved surface, curved toward the redistribution structure 110. The lower surface of the second conductive layer 132*b* may protrude from the first surface S1 of the interconnection structure 130. For example, the lowermost end of the second conductive layer 132*b* may be disposed on a level lower than a level of the first surface S1, but implementations thereof are not limited thereto.

In some implementations, the first conductive layer 132*a* and the second conductive layer 132*b* may include different metal materials. For example, the first conductive layer 132*a* may include copper (Cu), and the second conductive layer 132*b* may include at least one of nickel (Ni), gold (Au), silver (Ag), and chromium (Cr). The first conductive layer 132*a* may include the same material as a material of the other interconnection layers 132 other than the lowermost interconnection layer 132L among the plurality of interconnection layers 132. In some implementations, the first conductive layer 132*a* and the second conductive layer 132*b* may include the same metal material. For example, when both the first conductive layer 132*a* and the second conductive layer 132*b* include copper (Cu), the first conductive layer 132*a* and the second conductive layer 132*b* may be distinguished from each other by a grain boundary or a grain size. The grain size of the second conductive layer 132*b* may be determined by process conditions of a replating process. For example, an average grain size of the material included in the second conductive layer 132*b* may be smaller than an average grain size of the material included in the first conductive layer 132*a*, but implementations thereof are not limited thereto. In some implementations, the average grain size of materials included in the second conductive layer 132*b* may be greater than an average grain size of materials included in the first conductive layer 132*a*.

The encapsulant 140 may encapsulate at least a portion of each of the semiconductor chip 120 and the interconnection structure 130 on the redistribution structure 110. The encapsulant 140 may include an insulating material, for example, a thermosetting resin such as epoxy resin, a thermoplastic resin such as polyimide, or materials in which inorganic filler is impregnated with in the resins, such as, prepreg, ABF, FR-4, BT, an epoxy molding compound (EMC). The encapsulant 140 may include EMC.

The external connection conductors 150 may be disposed below the lower surface of the redistribution structure 110 and may be electrically connected to the redistribution layers 112. The external connection conductors 150 may physically and/or electrically connect the semiconductor package 100A to an external device. The external connection conductors 150 may include a conductive material and may have a ball shape, a pin shape, or a lead shape. For example, the external connection conductors 150 may be configured as solder balls.

Figure 2:
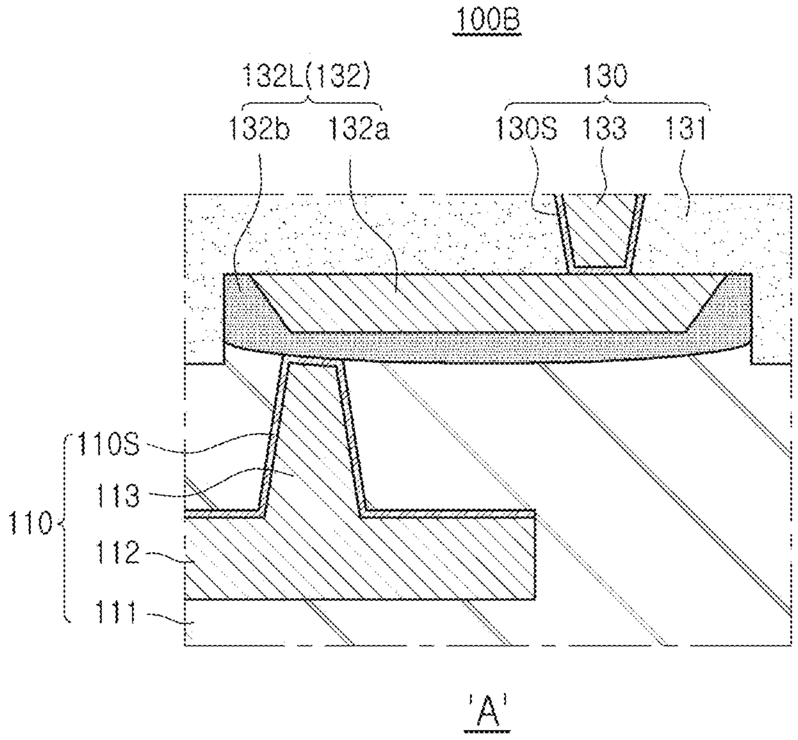
FIG. 2 is an enlarged diagram illustrating a region of a semiconductor package corresponding to region 'A' in FIG. 1A according to some implementations of the present disclosure.

FIG. 2 is an enlarged diagram illustrating a region of a semiconductor package, corresponding to region 'A' in FIG. 1A according to some implementations.

Referring to FIG. 2, the semiconductor package 100B may be configured the same as or similar to the example described with reference to FIGS. 1A to 1C, with the exception that at least a portion of the lower surface of the second conductive layer 132*b* of the semiconductor package 100B is disposed on a level higher than a level of the first surface S1 of the interconnection structure 130. An outer portion of the second conductive layer 132*b* adjacent to an inner wall of the upper insulating layer 131 may be disposed on a level higher than a level of the first surface S1 of the interconnection structure 130. Also, a central portion of the second conductive layer 132*b* may be disposed on a level equal to or higher than a level of the first surface S1 of the interconnection structure 130, but implementations thereof are not limited thereto. In some implementations, the lowermost end of the second conductive layer 132*b* may be disposed on a level lower than a level of the first surface S1 of the interconnection structure 130. The second conductive layer 132*b* in FIG. 2 may have a thickness smaller than that of the second conductive layer 132*b* in FIG. 1C. By including the replating layer 132*b* having a reduced thickness as described above, the replating process may be further simplified.

Figure 3:
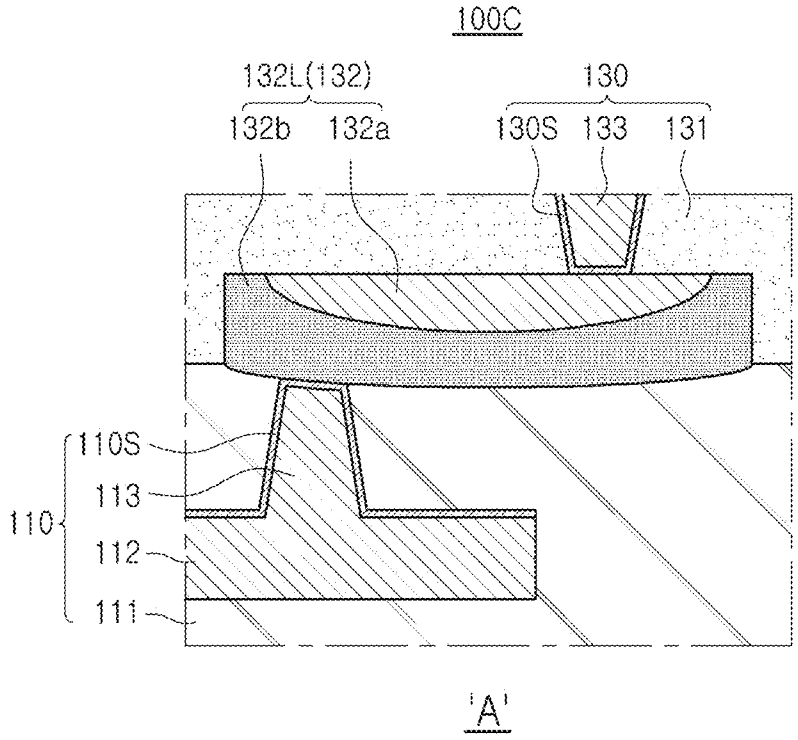
FIG. 3 is an enlarged diagram illustrating a region of a semiconductor package corresponding to region 'A' in FIG. 1A according to some implementations of the present disclosure.

FIG. 3 is an enlarged diagram illustrating a region of a semiconductor package, corresponding to region "A" of FIG. 1A according to some implementations.

Referring to FIG. 3, the semiconductor package 100C may be configured the same as or similar to the example described with reference to FIGS. 1A to 2, with the exception that a lower surface of the first conductive layer 132*a* of the semiconductor package 100C may be configured as an outwardly curved surface, curved toward the redistribution structure 110. The semiconductor package 100C may include a first conductive layer 132*a* having a cross-sectional surface of an outwardly curved semi-ellipse, curved toward the redistribution structure 110. The first conductive layer 132*a* may have a width decreasing downwardly toward an upper surface of the redistribution structure 110. The second conductive layer 132*b* may have a inwardly curved groove, curved toward the upper surface of the redistribution structure 110 to surround the first conductive layer 132*a*. The first conductive layer 132*a* may be formed by etching a lowermost interconnection pattern (132*p* in FIG. 6C) in a process described later, which will be described in greater detail with reference to FIG. 6C. In the etching process in FIG. 6C, the degree of etching of the region adjacent to the first surface S1 in the lowermost interconnection pattern (132*p* in FIG. 6C), exposed to an etchant for a longer time, may be greater. The first conductive layer 132*a* in FIG. 3 may have a thickness and a width smaller than those of the first conductive layer 132*a* in FIG. 1C. As described above, by including the first conductive layer 132*a* having a reduced size, the replating region between the first conductive layer 132*a* and the upper insulating layer 131 surrounding the first conductive layer 132*a* may increase, such that the replating layer 132*b* may be easily formed.

Figure 4:
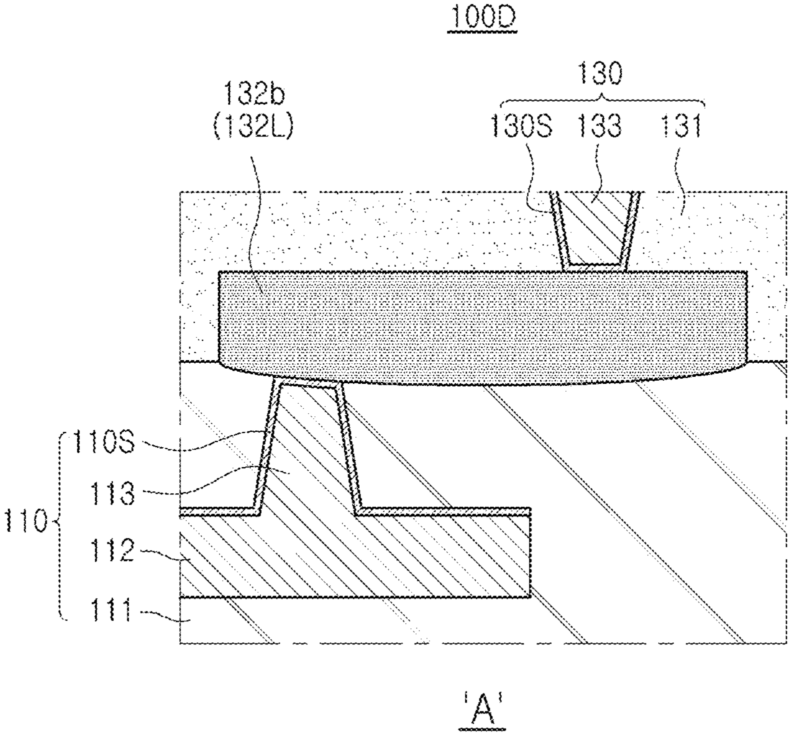
FIG. 4 is an enlarged diagram illustrating a region of a semiconductor package corresponding to region 'A' in FIG. 1A according to some implementations of the present disclosure.

FIG. 4 is an enlarged diagram illustrating a region of a semiconductor package, corresponding to region 'A' in FIG. 1A according to some implementations.

Referring to FIG. 4, a semiconductor package 100D in some implementations may be configured the same as or similar to the example described with reference to FIGS. 1A to 3, with the exception that the lowermost interconnection layer 132L of the semiconductor package 100D is configured as a single layer. The lowermost interconnection layer 132L may include only the replating layer 132*b*. In some implementations, the lowermost interconnection layer 132L may include at least one of nickel (Ni), gold (Au), silver (Ag) and chromium (Cr), and may include a metal material different from that of the upper interconnection layers 132 other than the lowermost interconnection layer 132L among the plurality of interconnection layers 132. In some implementations, the lowermost interconnection layer 132L may include copper (Cu) having a grain size different from that of the upper interconnection layers 132, but implementations thereof are not limited thereto. The lower surface of the replating layer 132*b* may be in contact with one of the first vias 113 disposed in the redistribution structure 110, and the upper surface of the replating layer 132*b* may be in contact with one of the second vias 133 disposed in the interconnection structure 130. By forming the lowermost interconnection layer 132L as a single layer as described above, a region between the lowermost interconnection layer 132L and the upper insulating layer 131 may be thoroughly filled.

Figure 5:
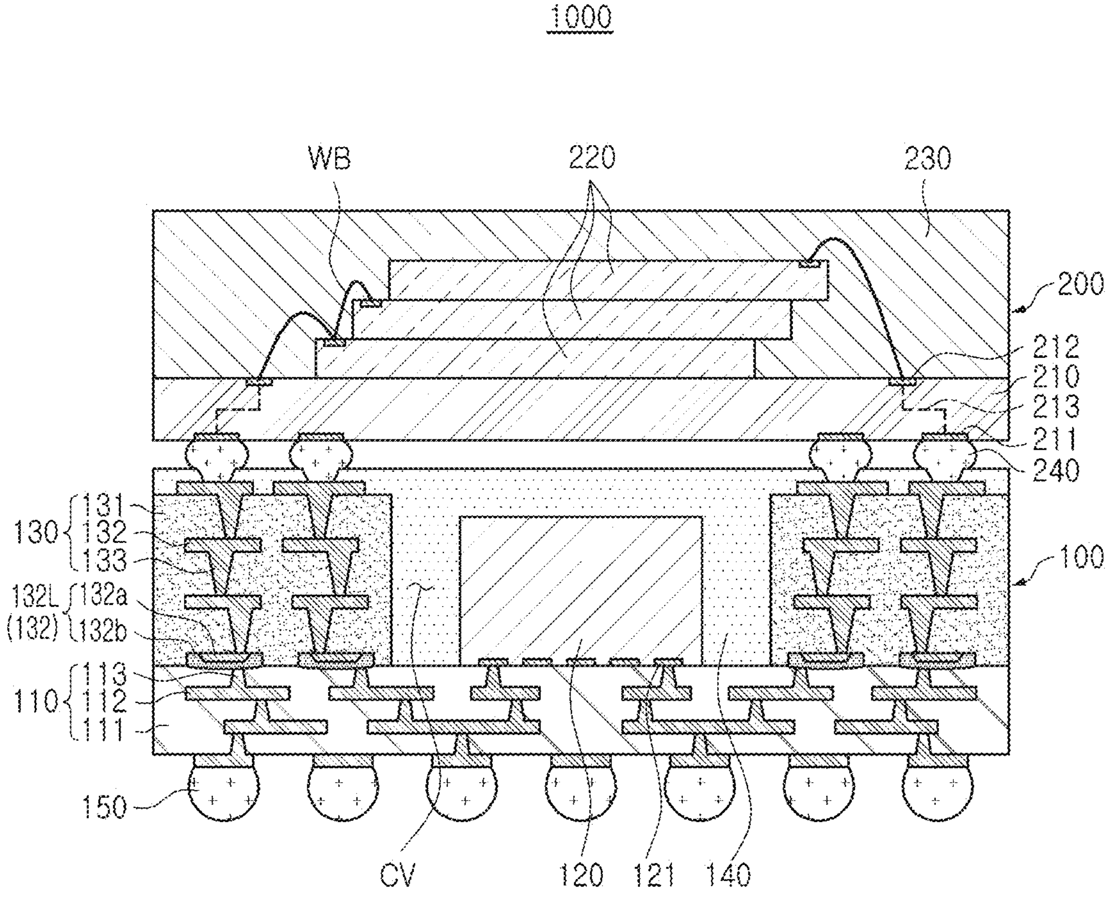
FIG. 5 is a diagram illustrating a semiconductor package according to some implementations of the present disclosure.

FIG. 5 is a diagram illustrating a semiconductor package according to some implementations.

Referring to FIG. 5, a semiconductor package 1000 in some implementations includes a lower package 100 and an upper package 200. The lower package 100 is illustrating the same as the semiconductor package 100A illustrated in FIG. 1A, but may be replaced with the semiconductor packages 100B, 100C, and 100D described with reference to FIGS. 2 to 4 or semiconductor packages configured similarly.

The upper package 200 includes an upper substrate 210, a second semiconductor chip 220, and a second encapsulant 230. The upper substrate 210 includes a lower pad 211 and an upper pad 212 electrically connected to an external entity on a lower surface and an upper surface, respectively. Also, the upper substrate 210 includes a redistribution circuit 213 electrically connecting the lower pad 211 to the upper pad 212.

The second semiconductor chip 220 may be mounted on the upper substrate 210 by wire bonding or flip chip bonding. For example, a plurality of second semiconductor chips 220 may be vertically stacked on the upper substrate 210 and may be electrically connected to the upper pad 212 of the upper substrate 210 by a bonding wire WB. In an example, the second semiconductor chip 220 may include a memory chip, and the first semiconductor chip 120 may include an AP chip.

The second encapsulant 230 may include a material the same as or similar to the encapsulant 140 of the lower package 100. The upper package 200 may be physically and electrically connected to the lower package 100 by the connection bump 240. The connection bump 240 may be electrically connected to the redistribution circuit 213 in the upper substrate 210 through the lower pad 211 of the upper substrate 210. The connection bump 240 may include a low melting point metal, for example, tin (Sn) or an alloy including tin (Sn).

Hereinafter, an example method of manufacturing a semiconductor package 100A illustrated in FIGS. 1A to 1C will be described with reference to FIGS. 6A to 6G.

FIGS. 6A to 6G are cross-sectional diagrams illustrating processes of a method of manufacturing a semiconductor package according to some implementations.

Figure 6A:
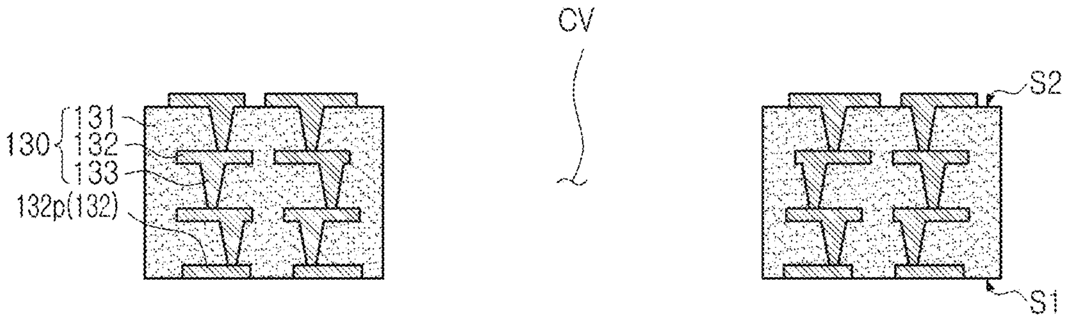
FIGS. 6A to 6G are cross-sectional diagrams illustrating processes of a method of manufacturing a semiconductor package according to some implementations of the present disclosure.

Referring to FIG. 6A, an interconnection structure 130 including an upper insulating layer 131 and a plurality of interconnection layers 132 may be prepared. The interconnection layer 132 disposed on the lowest level among the plurality of interconnection layers 132 may be referred to as a lowermost interconnection pattern 132*p*. The interconnection structure 130 may have a first surface S1 adjacent to the lowermost interconnection pattern 132*p* of the plurality of interconnection layers 132 and a second surface S2 opposite to the first surface S1. Among the plurality of interconnection layers 132, an uppermost interconnection layer 132 may be disposed on the second surface S2 of the interconnection structure 130 in a protruding form. The lowermost interconnection pattern 132*p* may be configured as an interconnection layer 132 disposed on the first surface S1 of the interconnection structure 130. The interconnection structure 130 may include a cavity region CV in a central portion.

Figure 6B:
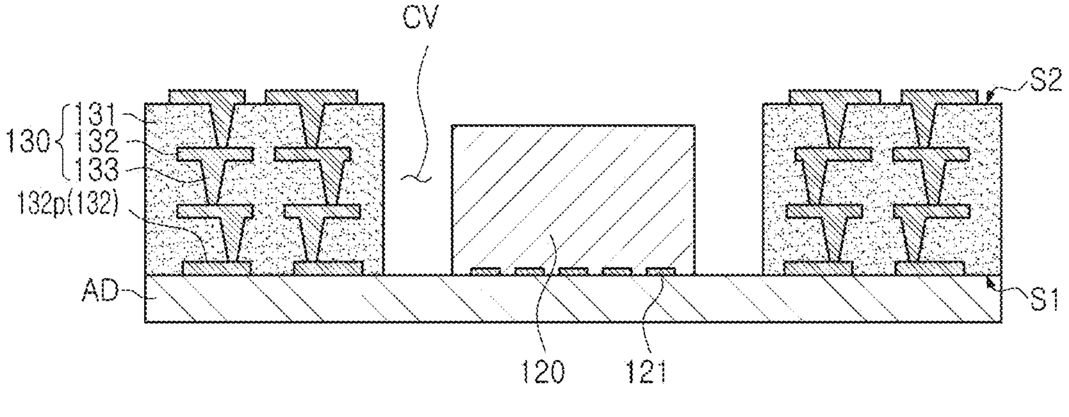

Referring to FIG. 6B, the interconnection structure 130 may be attached to the adhesive film AD, and the semiconductor chip 120 may be attached to the adhesive film AD. The first surface S1 of the interconnection structure 130 may be in contact with the adhesive film AD. The lowermost interconnection pattern 132*p* disposed on the first surface S1 of the interconnection structure 130 may be in contact with the adhesive film AD. The adhesive film AD may be implemented by a generally used tape.

The semiconductor chip 120 may be disposed in a cavity region CV disposed in a central portion of the interconnection structure 130. The semiconductor chip 120 may be attached to the adhesive film AD to face down, such that the active surface on which the connection pads 121 are aligned face the adhesive film AD, but implementations thereof are not limited thereto.

Figure 6C:
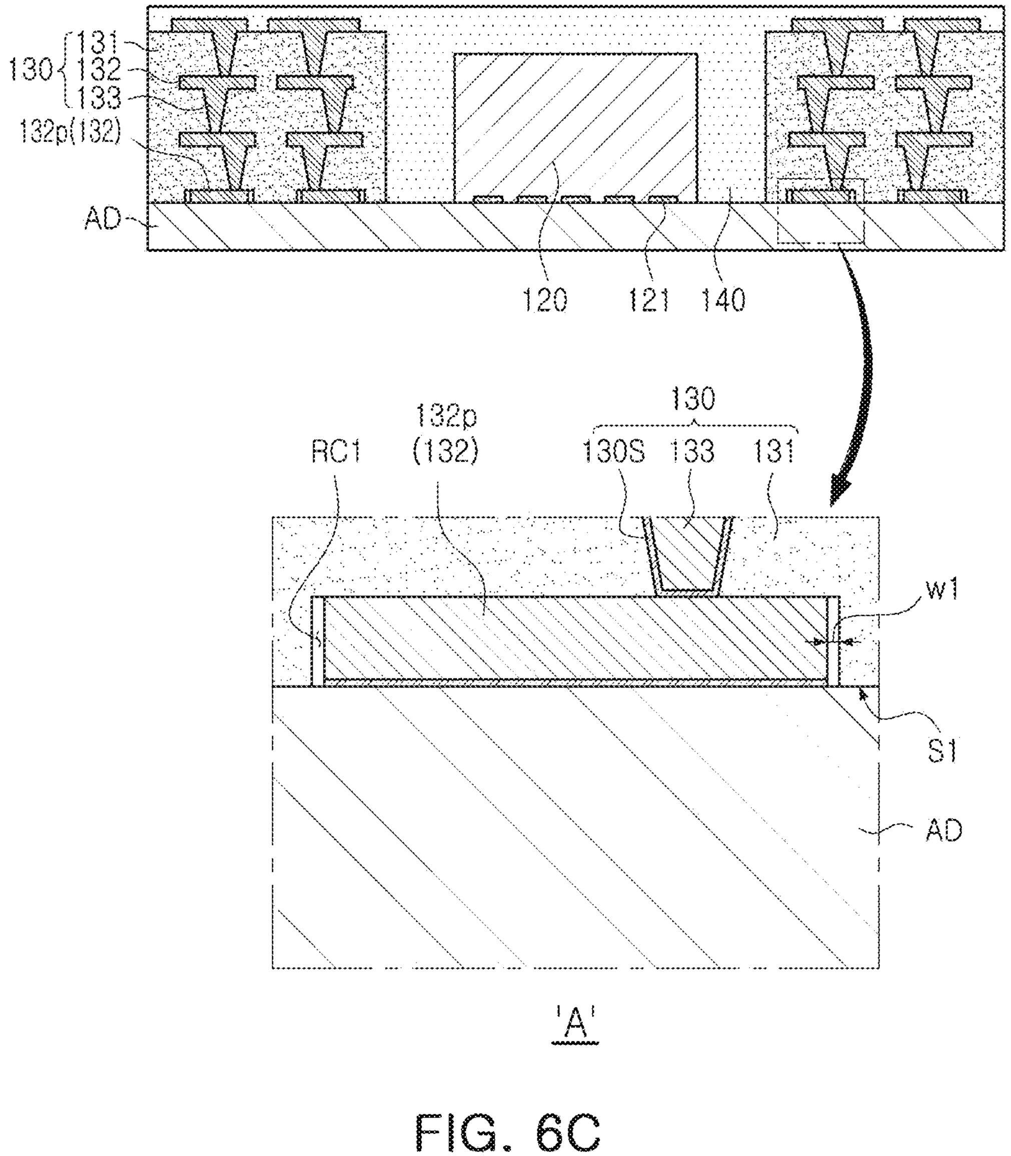

Referring to FIG. 6C, an encapsulant 140 covering at least a portion of the semiconductor chip 120 and the interconnection structure 130 may be formed.

An encapsulating material covering at least a portion of each of the semiconductor chip 120 and the interconnection structure 130 may be formed on the adhesive film AD. The encapsulating material may fill the cavity region CV of the interconnection structure 130. The encapsulating material may cover a portion of the interconnection layers 132 protruding from the second surface S2 of the interconnection structure 130 among the plurality of interconnection layers 132. The encapsulating material may include an epoxy molding compound (EMC). In some implementations, by curing the encapsulating material at a high temperature, delamination between a side surface of the lowermost interconnection pattern 132*p* and the upper insulating layer 131 surrounding the same may be induced. The encapsulating material may be cured at a temperature of about 200° C. or more, for example, about 200° C. to about 300° C., about 200° C. to about 250° C., or about 200° C. to about 220° C., but implementations thereof are not limited thereto. When the curing temperature of the encapsulating material is less than about 200° C., the lowermost interconnection pattern 132*p* and the upper insulating layer 131 may not be sufficiently delaminated. When the curing temperature of the material is higher than about 220° C., the upper insulating layer 131 may be damaged. The encapsulating material may be cured for about 1 hour or more, for example, about 1 to 3 hours, or about 2 hours, but implementations thereof are not limited thereto. In the process of forming the encapsulant 140, the side surface of the lowermost interconnection pattern 132*p* may be delaminated from the upper insulating layer 131 surrounding the same, such that a first recess region RC1 (hereinafter, may be referred to as a "delamination region") having a first width w1 may be formed.

Figure 6D:
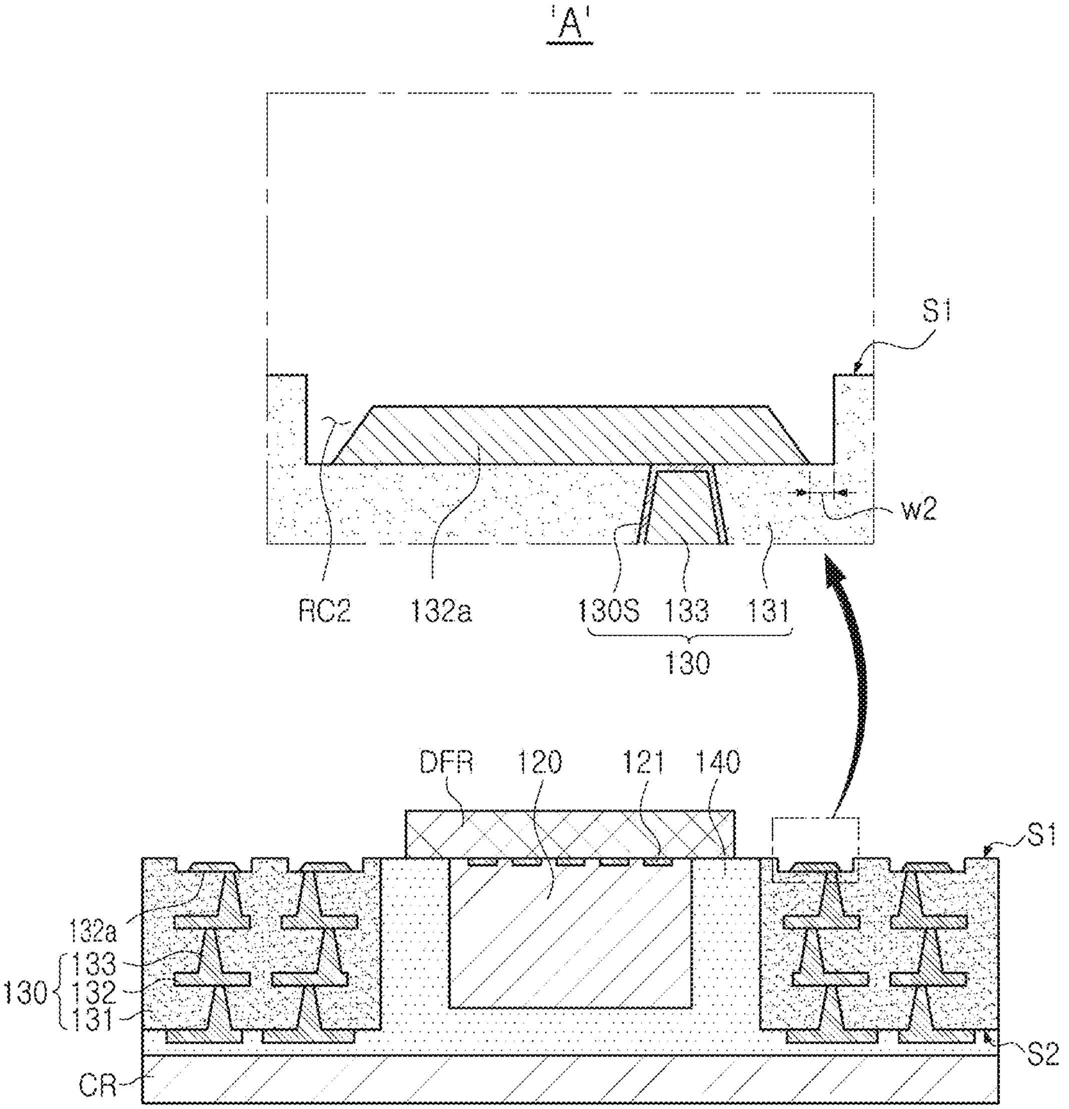

Referring to FIG. 6D, a protective film DFR may be attached to a semiconductor chip 120, and a first conductive layer 132*a* and a second recess region RC2 may be formed by etching the lowermost interconnection pattern 132*p*.

The carrier substrate CR may be attached to the encapsulant 140 to perform the process on the first surface S1 of the interconnection structure 130 in FIG. 6C, and in the drawings in FIGS. 6D to 6G, the entire structure may be rotated or reversed in the form of a mirror image of the structure illustrated in FIG. 6C for ease of description.

The protective film DFR may be attached to the active surface of the semiconductor chip 120 and may be disposed to cover the connection pads 121 and may prevent damages to the connection pads 121. The protective film DFR may be disposed to not cover the interconnection layers 132 of the interconnection structure 130.

The first conductive layer 132*a* may be formed by etching at least a portion of the lowermost interconnection pattern (132*p* in FIG. 6C). A portion of the lowermost interconnection pattern (132*p* in FIG. 6C) may be removed by a wet etching process. As the portion adjacent to the first surface S1 of the interconnection structure 130 among the lowermost interconnection patterns (132*p* in FIG. 6C) is more exposed to an etchant, the degree of etching thereof may be greater. The first conductive layer 132*a* may have a trapezoidal cross-sectional surface in which a length of a side in a horizontal direction adjacent to the first surface S1 is smaller, but implementations thereof are not limited thereto. The second recess region RC2 may correspond to a region other than the first conductive layer 132*a* formed by etching the lowermost interconnection pattern (132*p* in FIG. 6C). The second recess region RC2 may be a region extended from first recess region RC1. The second recess region RC2 may be referred to as a replating region. A minimum distance from the side surface of the first conductive layer 132*a* in the second recess region RC2 to the upper insulating layer 131 surrounding the same may be referred to as a second width w2. The second width w2 may be greater than the first width (w1 in FIG. 6C). By including the second recess region RC2 as described above, the replating effect in a process described later may improve.

Figure 6E:
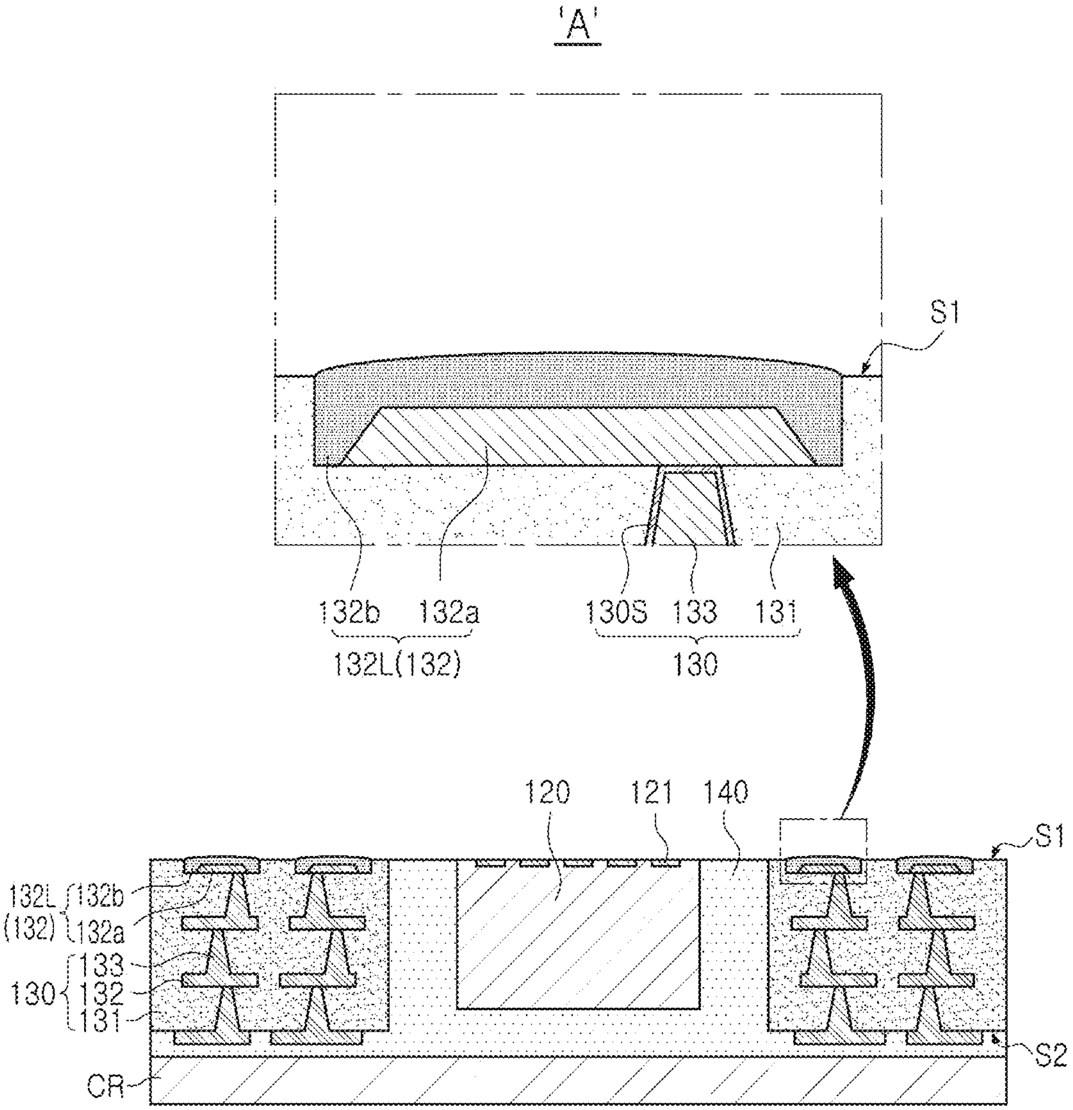

Referring to FIG. 6E, a second conductive layer 132*b* may be formed, and the protective film DFR on the semiconductor chip 120 may be removed.

The second conductive layer 132*b* may be formed by performing a replating process on the first conductive layer 132*a*. The thickness of the formed second conductive layer 132*b* may be controlled by density of applied current. The second conductive layer 132*b* may be referred to as a replating layer 132*b*. The replating layer 132*b* may have a form in which the second recess region (RC2 in FIG. 6D) is filled with metal. The second conductive layer 132*b* may have an outwardly curved cross-sectional surface. The second conductive layer 132*b* may have a boundary surface protruding from the first surface S1 of the interconnection structure 130, but implementations thereof are not limited thereto. In some implementations, at least a portion of the boundary surface of the second conductive layer 132*b* may be disposed on an inner side of the first surface S1 of the interconnection structure 130 (see the example in FIG. 2). In some implementations, the second conductive layer 132*b* may include a metal different from the first conductive layer 132*a*, but implementations thereof are not limited thereto.

Figure 6F:
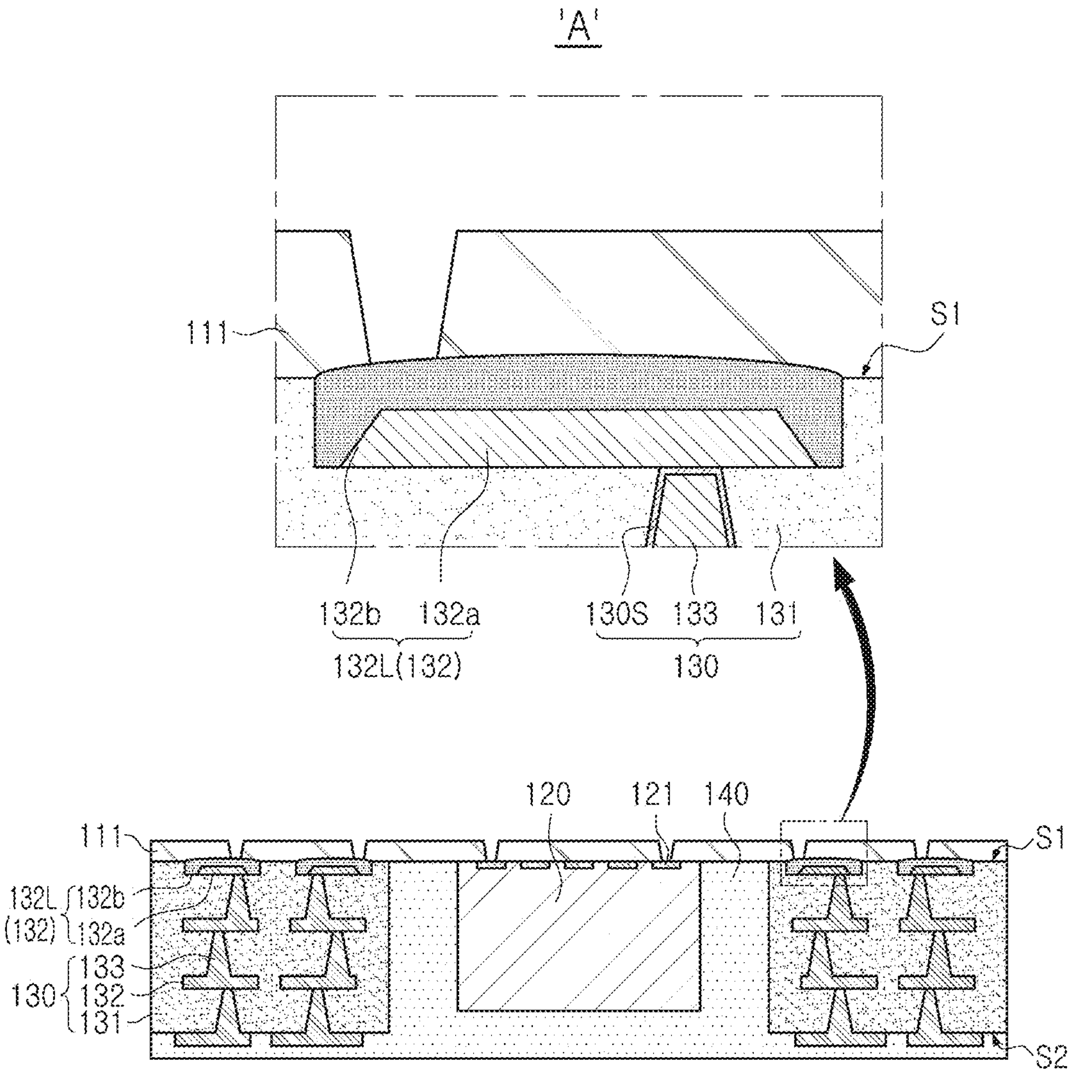

Referring to FIG. 6F, a lower insulating layer 111 may be formed on the interconnection structure 130, the semiconductor chip 120 and the encapsulant 140.

The lower insulating layer 111 may be formed on the first surface S1 of the interconnection structure 130, and specifically, the lower insulating layer 111 may be formed on the replating layer 132*b* protruding from the first surface S1 of the interconnection structure 130. In some implementations, the lower insulating layer 111 may include a photosensitive insulating resin. For example, the lower insulating layer 111 may include photoimageable dielectric (PID). An opening may be formed by removing a portion of the lower insulating layer 111, and the opening may be formed using a photolithography process. The opening may be formed in a tapered shape, tapered toward the first surface S1 of the interconnection structure 130.

Figure 6G:
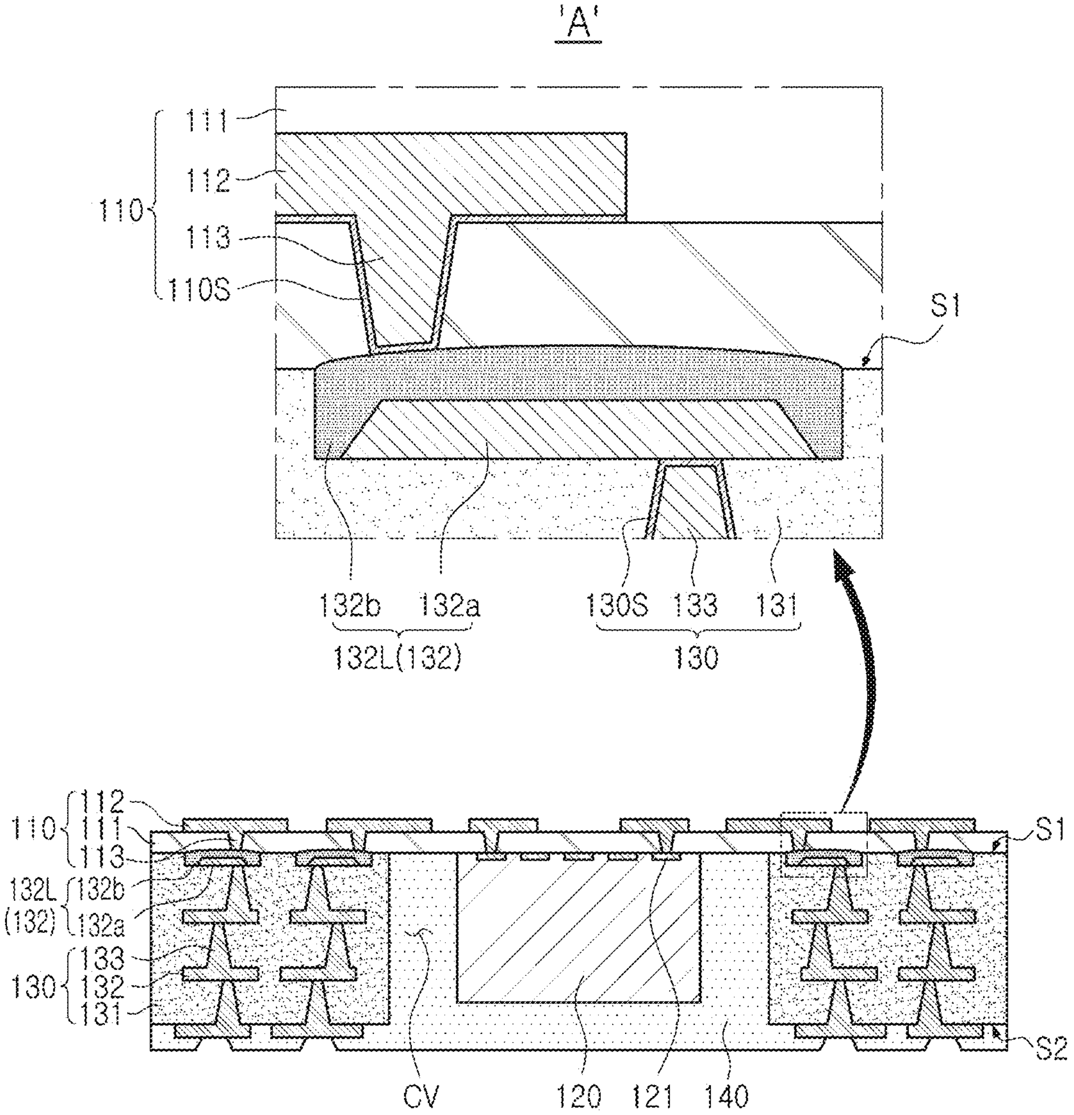

Referring to FIG. 6G, a redistribution layer 112 and a redistribution via 113 may be formed on the lower insulating layer 111.

A seed layer for forming the redistribution layer 112 and the redistribution via 113 may be formed on the lower insulating layer 111 and the opening. At least a portion of the seed layer may be in contact with the second conductive layer 132*b*. The redistribution layer 112 and the redistribution via 113 may be formed according to the position of a photoresist film disposed on the seed layer. The redistribution layer 112 and the redistribution via 113 may be formed by performing a plating process. After removing the photoresist film, a portion of the seed layer may be removed.

Subsequently, the redistribution structure 110 illustrated in FIG. 1A may be formed by repeating a series of processes described with reference to FIGS. 6F and 6G. Also, by forming the external connection conductors 150 electrically connected to the redistribution layers 112 on the redistribution structure 110, the semiconductor package 100A in FIGS. 1A to 1C may be manufactured.

According to the aforementioned implementations, by including a replating layer filling a gap between the insulating layer and the interconnection layer, a semiconductor package having improved reliability may be provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the implementations have been illustrating and described above, it will be configured as apparent to those skilled in the art that modifications and variations may be made without departing from the scope as defined by the appended claims.

What is claimed is:

1. A semiconductor package, comprising:

a redistribution structure having an upper surface and a lower surface opposing each other, wherein the redistribution structure includes a lower insulating layer, a plurality of redistribution layers disposed in the lower insulating layer, and a plurality of first vias connected to the plurality of redistribution layers, respectively;

a semiconductor chip disposed on the upper surface of the redistribution structure and electrically connected to the plurality of redistribution layers;

an interconnection structure disposed on the upper surface of the redistribution structure and including an upper insulating layer, a plurality of interconnection layers disposed in the upper insulating layer, and a plurality of second vias connecting the plurality of interconnection layers to each other;

an encapsulant covering at least a portion of each of the semiconductor chip and the interconnection structure on the upper surface of the redistribution structure; and a plurality of external connection conductors disposed on the lower surface of the redistribution structure and electrically connected to the plurality of redistribution layers, wherein a lowermost interconnection layer adjacent to the upper surface of the redistribution structure among the plurality of interconnection layers includes:

a first conductive layer that contacts one second via of the plurality of second vias and is tapered toward the upper surface, and a second conductive layer that surrounds the first conductive layer and contacts one first via of the plurality of first vias.

2. The semiconductor package of claim 1, wherein the first conductive layer includes a different metal from a metal included in the second conductive layer.

3. The semiconductor package of claim 2, wherein the first conductive layer includes copper (Cu), and wherein the second conductive layer includes at least one of nickel (Ni), gold (Au), silver (Ag), or chromium (Cr).

4. The semiconductor package of claim 1, wherein the first conductive layer has a different grain size than a grain size of the second conductive layer include copper (Cu).

5. The semiconductor package of claim 1, wherein the plurality of first vias and the plurality of second vias have a tapered shape that is tapered toward the upper surface of the redistribution structure.

6. The semiconductor package of claim 1, wherein the semiconductor chip further includes a plurality of connection pads that contacts the plurality of first vias.

7. The semiconductor package of claim 1, wherein the first conductive layer has a trapezoidal cross-sectional surface of which an upper side is longer than a lower side.

8. The semiconductor package of claim 1, wherein the first conductive layer has a cross-sectional surface including an outwardly curved surface that is curved toward the upper surface of the redistribution structure.

9. The semiconductor package of claim 1, further comprising:

an upper package disposed on the interconnection structure; and a plurality of connection bumps electrically connecting the upper package to the plurality of interconnection layers of the interconnection structure.

10. The semiconductor package of claim 1, wherein the upper insulating layer includes a different material from a material of the lower insulating layer.

11. The semiconductor package of claim 10, wherein the upper insulating layer includes a prepreg, and wherein the lower insulating layer includes a photo imageable dielectric (PID).

12. The semiconductor package of claim 1, wherein the second conductive layer has an outwardly curved lower surface that is curved toward the upper surface of the redistribution structure.

13. A semiconductor package, comprising:

a redistribution structure including a plurality of redistribution layers;

a semiconductor chip disposed on the redistribution structure and electrically connected to the plurality of redistribution layers;

an interconnection structure disposed on the redistribution structure, wherein the redistribution structure includes:

an insulating layer, a lowermost interconnection layer disposed in the insulating layer and exposing a lower surface of the insulating layer, a plurality of upper interconnection layers disposed in or on the insulating layer, and a plurality of interconnection vias electrically connecting the lowermost interconnection layer to the plurality of upper interconnection layers; and an encapsulant covering at least a portion of the semiconductor chip and the interconnection structure on the redistribution structure, wherein the lower surface of the lowermost interconnection layer includes an outwardly curved surface that is curved toward the redistribution structure.

14. The semiconductor package of claim 13, wherein a lowermost end of the lowermost interconnection layer is disposed at a level lower than a level of the lower surface of the insulating layer.

15. The semiconductor package of claim 13, wherein at least a portion of the lower surface of the lowermost interconnection layer is disposed at a level higher than a level of the lower surface of the insulating layer.

16. The semiconductor package of claim 13, wherein the lowermost interconnection layer is configured as a single layer.

* * * * *